United States Patent [19]

Hartmann

[11] Patent Number: 5,246,882
[45] Date of Patent: Sep. 21, 1993

[54] METHOD FOR EMBODYING AN ELECTRIC CIRCUIT ON AN ACTIVE ELEMENT OF AN MIS INTEGRATED CIRCUIT

[75] Inventor: Joël Hartmann, Claix, France

[73] Assignee: Commissariat A L'Energie Atomique, Paris, France

[21] Appl. No.: 722,120

[22] Filed: Jun. 27, 1991

[30] Foreign Application Priority Data

Jun. 28, 1990 [FR] France ............................... 90 08167

[51] Int. Cl.⁵ .................. H01L 21/283; H01L 21/336
[52] U.S. Cl. ....................................... 437/195; 437/56;
437/228; 437/978; 156/653
[58] Field of Search ............... 437/195, 228, 947, 981,
437/225, 241, 49, 52, 50, 229, 982, 978, 56;
156/651, 652, 653, 657

[56] References Cited

U.S. PATENT DOCUMENTS

| 4,299,862 | 11/1981 | Donley . | |
|---|---|---|---|
| 4,485,553 | 12/1984 | Christian et al. | 437/231 |
| 4,789,648 | 12/1988 | Chow et al. | 437/225 |
| 5,010,039 | 4/1991 | Ku et al. | 437/228 |
| 5,022,958 | 6/1991 | Favreau et al. | 437/228 |
| 5,032,530 | 7/1991 | Lowrey et al. | 437/34 |

FOREIGN PATENT DOCUMENTS

| 0155699 | 9/1985 | European Pat. Off. . | |
|---|---|---|---|
| 2-58252 | 2/1990 | Japan | 437/978 |

OTHER PUBLICATIONS

Grewal, V., et al., "Contact hole and via . . .", 1987 Proceedings V-MIC Conf., Jun. 15-16, pp. 298-305.
Kaanta, C., et al., "Submicron Wiring . . .", 1988 Proceedings V-MIC Conf., Jun. 13-14, pp. 21-28.

Primary Examiner—T. N. Quach
Attorney, Agent, or Firm—Cesari and McKenna

[57] ABSTRACT

A method of making an electric contact of an MIS integrated circuit includes the following stages: depositing a thick film made of one first electric nonconductor on the integrated circuit provided with this element; depositing on the first nonconductor film a crash or barrier film made of a highly resistive material or a nonconductor able to be etched selectively with respect to the first nonconductor and a second electric nonconductor; forming opposite the active element a first opening in the barrier film and fixing the dimensions at the level of the active element of the electric contact to be embodied; depositing on the resulting structure obtained at least one second nonconducting film forming a second opening in the second nonconducting film, the second opening having a width larger than that the first opening; etching of the first nonconductor exposed during the previous step by using the etched barrier film as a mask, thus forming an electric contact hole of the active element, and metallizing of this contact hole.

7 Claims, 4 Drawing Sheets

METHOD FOR EMBODYING AN ELECTRIC CIRCUIT ON AN ACTIVE ELEMENT OF AN MIS INTEGRATED CIRCUIT

FIELD OF THE INVENTION

The present invention concerns a method to embody an electric contact on an active element of a MIS integrated circuit. It is applicable to any MIS or MOS device comprising at least one transistor grid and one electric contact and, in particular in the sphere of nMOS, pMOS, CMOS and BICMOS type integrated circuits and more particularly to highly complex integrated circuits where the reduction of patterns is required. These circuits are semiconductor memories, microprocessors and microcontrollers.

BACKGROUND OF THE INVENTION

With the reduction of the critical dimensions of integrated circuits and more particularly the dimension of the MOS transistor grids, n type and p type transistors are now embodied with a double implantation method reference LDD making it possible to resolve the problems of piercing between the source and the drain of these transistors.

This double implantation method is mainly used for integrated circuits whose grid dimensions are smaller than 2 $\mu$m.

SUMMARY OF THE INVENTION

As the method of the invention is completely adapted to LDD transistor circuits, the following description of the prior art only concerns these integrated circuits. However, the invention is also applicable to single junction transistors.

The illustration of double junction transistors is in this case justified by the fact that the invention more particularly concerns a submicronic technology which, for reasons of reliability, requires this type of junction but, of course, the invention could be considered with single junction transistors.

FIGS. 1A and 1B diagrammatically show in a longitudinal section the various stages for embodying an electric contact and the corresponding contact hole according to the prior art and situated between two MOS transistor grids of an integrated circuit. These transistors are transistors with N channels embodied on a P type monocrystalline silicon substrate.

FIG. 1A shows a section of the integrated circuit after it has been embodied on the substrate 1, the grid nonconductor 2 and the polycrystalline silicon grids 4 of the MOS transistors, the formation of the N- type regions 6 of the source and drain regions, the formation of spacers 8 on the flanks of the grids 4, and then the formation of the type N+ regions 10 of the sources and drains of the transistors. The reference 11 indicates the active zone on which it is desired to embody the electric contact.

After a thermic reoxidation 12 of several tens of nanometers of the source and drain regions and of the grids 4, a depositing is effected of an electric double film nonconductor, constituted by an intrinsic or nondoped film of silicon oxide 14 with a thickness of between 0 and 100 nm, and a film of oxide 16 doped with phosphorus, such as PSG (silicated glass doped with phosphorus) or doped with boron and phosphorus, such as BPSG (silicated glass doped with boron and phosphorus).

The non-doped film 14 is used to limit diffusion of the boron or phosphorus in the grid where the junctions of the MOS transistors are situated. Its use is thus not necessary since the thermic reoxidation 12 suffices to carry out this role.

The set of the nonconducting films 12, 14 and 16 ensure electric insulation between the grid and the source (or drain).

This is followed by a thermic treatment intended to make the nonconducting film 16 yield, followed by forming by photolithography a resin mask 18 making it possible to define the location and dimensions of the contact hole to be embodied. This mask 18 is positioned with respect to the grids 4 of the transistors or with respect to the active zones 6-10; the opening 20 of the mask delimiting the contact hole to be embodied is situated opposite the active zone 11.

Then an anisotropic etching is made of the films 16, 14 and 12 until the active zone 11 of the substrate 1 is exposed, as shown on FIG. 1B, followed by the depositing of a metallic film 22 intended to form the electric contact.

Current photolithographic techniques make it possible to print openings 20 with a diameter of 0.8 $\mu$m in the resin. But having regard to the thickness of the nonconductor to be etched, the final diameter d of the electric contact hole 24 is usually wider than that of the opening 20, that is about 1 $\mu$m.

So as to avoid any risk of short-circuit occurring by the contact hole 24 between the grids 4 of the transistors and the metallization 22, it is necessary to apply a minimum clearance 26 between the flanks of the grids and the edge of the contact hole 24. This clearance takes account of the positioning tolerance (or alignment) between the contact hole 24 and the grids and makes it possible to maintain a minimum nonconducting thickness between the two. In this case, the width 1 of the clearances 26 is 0.8 $\mu$m at the most.

In these circumstances, it can be seen that the minimum dimension D between two grids separated by a contact is 2.6 $\mu$m. This minimum distance is, in addition, only possible if the filling of the contact hole 24 can be effected at the time of metallization 22 by a conforming depositing technique.

The filling of the contact hole 24 cannot be embodied conventionally with the aid of an aluminum deposit or an aluminum alloy by cathodic evaporation. In fact, these materials exhibit poor working covering in a hole whose height h is larger than its diameter d, thus resulting in an improper filling of the contact hole and possibly electric discontinuities.

The filling of the contact hole, as shown on FIG. 1B, may be embodied by the CVD (vapor phase chemical depositing) depositing of tungsten.

In fact, this material is deposited with the same thickness on the horizontal portions (bottom of the hole and insulant top 16) and vertical portions (hole flanks), which enables the contact hole to be filled completely.

The use of tungsten deposited by CVD for contact embodiment is described in the article by C. Kaanta and al and entitled "Submicron wiring technology with tungsten and planarization", V. MIC Conf. 1988, 13-14 Jun., CH-2624-5-1988, p. 21-28.

This tungsten deposit may either be etched so as to only retain the tungsten in the contact hole, the electric interconnection lines then being embodied via a deposit on the entire circuit followed by the etching of a film of aluminum, or be etched so as to embody there the interconnection lines.

Unfortunately, the techniques for depositing and etching tungsten required for submicronic devices are only currently being researched and studied and are scarcely used industrially.

Moreover, the tungsten has high resistivity which is three times greater than that of aluminum, which poses problems concerning the propagation speed of information in the integrated circuit.

Finally, the embodiment of electric contacts and interconnection lines in two conductive materials somewhat complicates the method for embodying integrated circuits, thus increasing their production cost.

So as to retain a conventional aluminum metallization, it is necessary to modify the method described above. This modified method is shown diagrammatically as a longitudinal section on FIGS. 2A to 2C. The aim of this method is to enlarge the upper portion of the electric contact hole so as to allow the latter to be provided with good covering by the aluminum.

After embodiment of the mask 18, firstly an isotropic etching is made of the nonconducting film 16 over half its thickness, as shown on FIG. 2A, so as to obtain a funnel-shaped contact hole 24a flared in its upper portion. In fact, an isotropic etching allows for an attack of the nonconductor 16 projecting on both sides of the opening 20 of the mask 18.

Then, an anisotropic etching is made of the films 6, 14 and 12 as far as the substrate 1. The structure is the one shown on FIG. 2B. Then the resin mask 18 is eliminated and the nonconductor 16 is eroded so as to obtain the structure shown on FIG. 2C.

This method, known as a contact facet cutting method, is described in the document V-MIC Conf. of 15-16 Jun. 1987, CH-2488-5-1987 IEEE p. 298-305 and entitled "Contact hole and via profiling by high rate isotropic and anisotropic etching of oxides" by V. Grewal and al.

Unfortunately, this method again results in enlarging the clearances 26a between the grids 4 of the transistors and the electric contact 24a. In the case described above, the width 1' of the clearances is 1 μm, which results in a dimension D' between the two grids separated by a contact of 3 μm. This prevents increasing the integration density of the integrated circuits.

SUMMARY OF THE INVENTION

The object of the invention is to provide a method for embodying an electric contact on an active element of a MIS circuit and makes it possible to overcome the drawbacks mentioned above. In particular, it makes it possible to reduce the contact/grid distance of an MIS transistor while enlarging the upper portion of the contact hole and thus making it possible to retain a conventional aluminum metallurgy. The reduction of the distance between the contact and the grid makes it possible to increase the integration density of the corresponding circuit.

The invention may also be applied on each occasion it is desired to connect an active zone (source or drain) or a grid of an MIS transistor of an integrated circuit to another active zone or grid of an active component of the circuit. Moreover, this transistor may be a transistor with single or double junctions.

More specifically, the object of the invention is to provide a method for embodying an electric contact on an active element of a MIS integrated circuit and including the following stages:

a) - depositing a thick film of a first electric nonconductor on the integrated circuit;

b) - depositing on the first nonconductive film a crash film made of a highly resistive material or a nonconductor able to be etched selectively with respect to the first nonconductor and to a second electric nonconductor;

c) - forming opposite the active element of a first opening in the crash film, thus fixing the dimensions at the level of the active element of the electric contact to be embodied;

d) - depositing at least one second nonconducting film on the structure obtained at c;

e) - forming opposite the first opening a second opening in the second nonconducting film, the second opening having a width larger than that of the first opening;

f) - etching of the first nonconductor exposed during stage e by using the etched crash film as a mask, thus embodying an electric contact hole of the active element, and g) - metallizing of this contact hole.

An active element is understood to be a grid, a drain or a source of an MIS transistor.

In the method of the invention, the real width of the electric contact on the active zone is defined by the width of the first opening.

The upper width of the electric contact is defined by the width of the second opening and may clearly be wider, thus allowing for proper filling of the structure by a conventional metallurgy without risking any short-circuit occurring with the grid of the transistors by virtue of the presence of the crash film which makes it possible to retain the thickness of the first nonconductor completely around the grid.

Thus, it is possible to use aluminum or an aluminum-based alloy for metallization of the contact hole. For example, it is possible to use an aluminum and silicon alloy or an aluminum and copper alloy to be deposited by cathodic evaporation.

The etching crash film also makes it possible to reduce the distance between the contact and the grid of the transistor since the facet cutting of the electric contact is effected without affecting the thickness of the first nonconductor.

In the case of an anisotropic etching of the first nonconductor, the control of the width of the contact hole in its lower portion is much more precise than in the prior art since it is effected in a thin crash film. This thus makes it possible to also reduce the contact/grid distance.

The role of the first nonconductor in a MIS transistor is to ensure electric isolation between the active zones (source and drain) and the grid of this transistor. Its thickness thus needs to be large so as to ensure this electric isolation and especially so as to reduce any stray capacity between the various connections of the transistor. This film normally should have a minimum thickness of 200 nm and a maximum thickness of 600 nm.

The invention is applicable to a large number of semiconductive substrates, such as silicon doped with type n or p, as well as GaAs, InP, HgCdTe, etc. However, the invention i fully suitable for silicon technology.

The electric nonconductors may be embodied from a large number of materials, such as non-doped silicon oxide, silicon nitride, silicon oxinitride, silicated glass doped with phosphorus or borosilicated glass doped with phosphorus. The first nonconductor is made of silicon oxide not doped with silicon nitride or silicon oxinitride.

Moreover, the crash film may be made of polycrystalline silicon, silicon nitride, silicon oxinitride or silicon oxide. When the first conductor is silicon oxide, the crash film is advantageously made of non-doped silicon nitride or polycrystalline silicon.

When the crash film is made of polycrystalline silicon, the second nonconductor is advantageously constituted by a double-film nonconductor and in particular by a non-doped film of silicon oxide surmounted with BPSG. The use of a non-doped oxide between the silicon crash film and the doped oxide makes it possible to avoid the silicon being doped by the BPSG. In fact, the polycrystalline silicon needs to remain extremely resistive so as to avoid a stray current occurring between two adjacent contacts with different potentials.

The method of the invention is applicable to all types of contacts to be embodied and, in particular, contacts on the active zones, such as the sources and drains of the transistors or even on the grids of these transistors. In addition, these transistors may be monogrid or multigrid transistors (case of EPROM memories, for example) with single or double junctions.

BRIEF DESCRIPTION OF THE DRAWINGS

Other characteristics and advantages of the invention shall appear more readily from a reading of the following non-restrictive description given by way of illustration with reference to the accompanying drawings in which.

DETAILED DESCRIPTION OF THE PREFERRED EMBODIMENTS

The following description relates to the embodiment of a double junction transistor with a MOS field effect with n channels in a type p silicon substrate. But of course, as seen earlier, the range of application of the invention is much more general.

Those elements unchanged with respect to the prior art described above shall bear the same references.

Figure 1A:
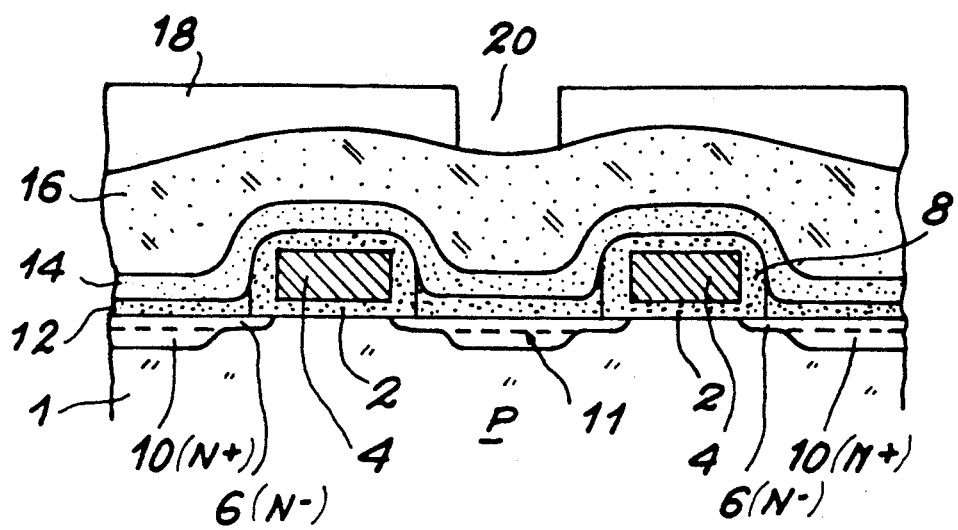
FIGS. 1A-1B and 2A-2C, already described, diagrammatically show as a longitudinal section the various stages for embodiment according to the prior art of an electric contact between two MOS double junction transistors, and FIGS. 3A-3F diagrammatically show a longitudinal section of the various production stages of the invention for embodying an electric contact between two MOS double junction transistors.
Figure 1B:
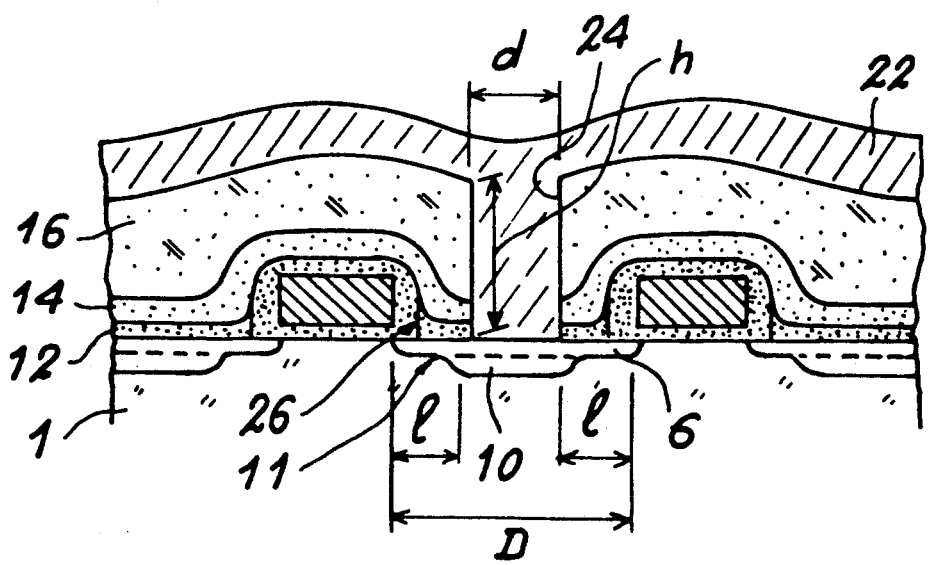
Figure 2A:
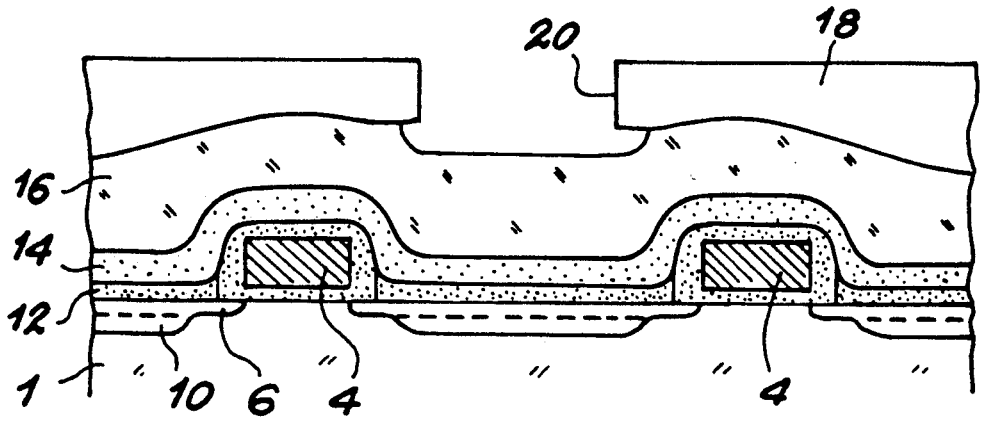
Figure 2B:
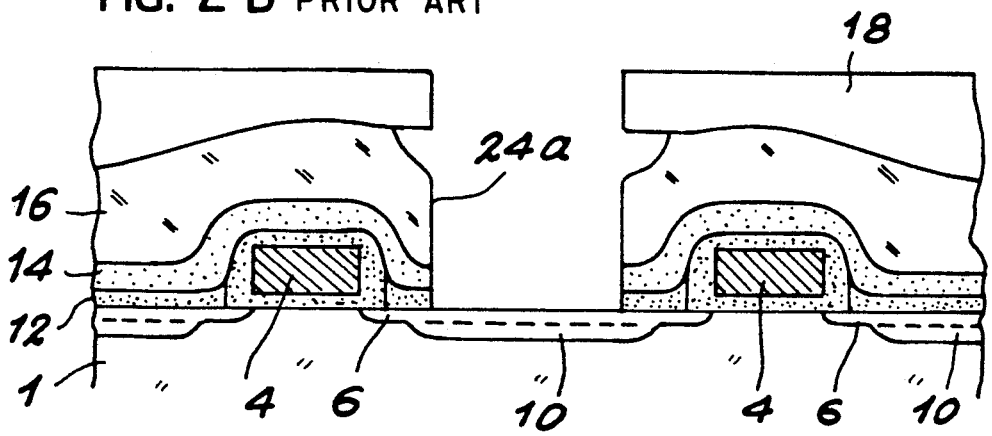
Figure 2C:
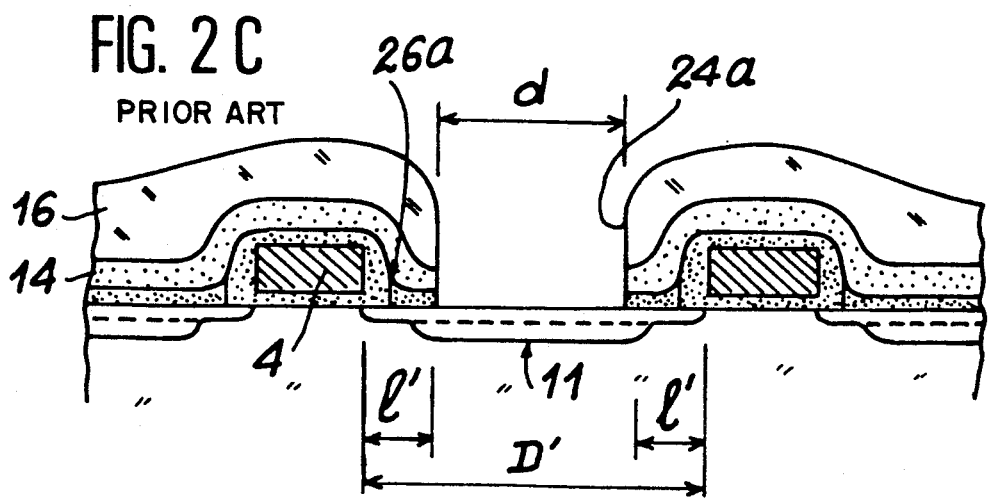
Figure 3A:
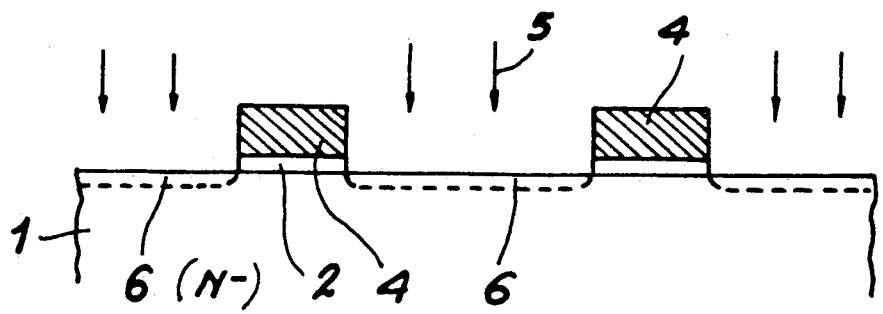

As shown on FIG. 3A and in accordance with the prior art, firstly the grid oxide 2 of the MOS transistors is formed on the type p monocrystalline silicon substrate 1 by means of the thermic oxidation of the substrate. It has a thickness of about 20 nm.

Then a film of polycrystalline silicon, doped with Phosphorus with a concentration of between 5 and 10% in weight, is deposited by CVD. This film has a thickness of about 400 nm.

Then a photoetching is made of the polycrystalline silicon fixing the dimensions of the grids 4 of the transistors. In particular, they have a width of less than 2 $\mu$m measured along the plane of FIG. 3A.

Then, a low dose of type n ions 5 is implanted, such as phosphorus with an energy of 60keV and a dose of $10^{13}$ ions/cm by using the grids 4 as masks for this implantation, thus resulting in the formation of type N- regions 6 constituting the first junctions of the source and drain regions.

Figure 3B:
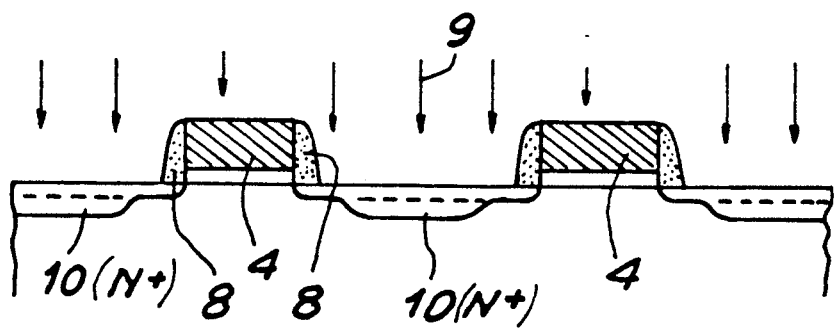

Then, as shown on FIG. 3B, the spacers 8 are formed on the lateral flanks of the grids 4 and having width at the base of between 200 and 300nm, the aim of these spacers being to push back the high dose implantation of the edges of the grids of each transistor. These spacers may be made of silicon oxide.

They are conventionally obtained via the isotropic depositing of an oxide film followed by the full plate anisotropic etching of this film.

Figure 3C:
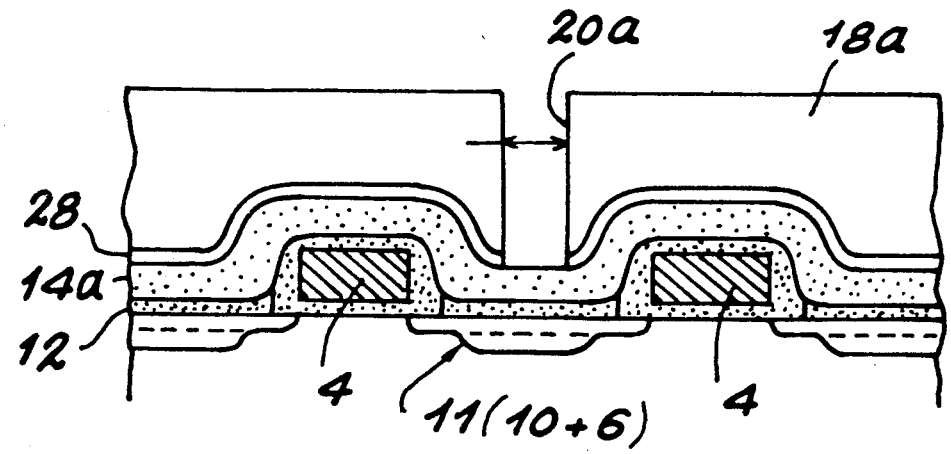

Then, a high dose of type n ions 9 is implanted, such as arsenic with a dose of $5 \times 10^{15}$ ions/cm and an energy of 100keV by using the grids 4 and the spacers 8 as masks for this implantation. Thus, two type N+ regions 10 are obtained on both sides of the grids of the transistors under the regions 6, thus constituting the double junctions of the MOS transistors. Then, as shown on FIG. 3C, the electric isolation 12 of the entire circuit is carried out consisting of a thermic reoxidation of the source and drain regions 6-10 and the grids 4. This nonconductor has approximately a thickness of between 10 and 20nm on the source and drain regions.

Then, a film of silicon oxide 14a, intrinsic or not intentionally doped, is deposited on the entire circuit constituting the first nonconductor. The purpose of this film 14a is to ensure electric isolation between the grid of the transistor and, respectively the source and the drain. This deposit may be embodied by chemical vapor phase depositing at atmospheric pressure (APCVD) or by low pressure chemical vapor phase depositing (LPCVD) by tetraethylorthosilicate pyrolysis (TEOS) at 800° C.

In accordance with the invention, this film 14a is thicker than the film 14 of the prior art as it defines the minimum thickness of the nonconductor between the edge of the grids 4 and the electric contact to be embodied. In particular, this film has a thickness of 300nm instead of a maximum of 100nm in the prior art.

According to the invention, a crash film 28 is then deposited, for example made of intrinsic polycrystalline silicon or silicon nitride with a thickness of 50nm. This film is deposited by LPCVD.

Then a first resin mask 18a is embodied by photolithography and comprising an opening 20a defining the location and dimensions of the electric contact to be embodied at the level of the active zone 11. This mask 18a is positioned (or aligned) with respect to the grids 4 of the transistors. In particular, the opening 20a is situated opposite the active zone 11 situated between the grids 4 of the transistors. The opening 20a may have a diameter of 0.8 $\mu$m.

Then, a selective etching is made of the film 28 with respect to the nonconductor 14a, this etching possibly being an ionic etching reacting with SF6 gas for the polycrystalline silicon film 28 so as to eliminate the regions of the non-masked film 28. The stoppage of etching is effected on the film 14a.

Then, the mask 20a is eliminated with the aid of an oxygen plasma.

Figure 3D:
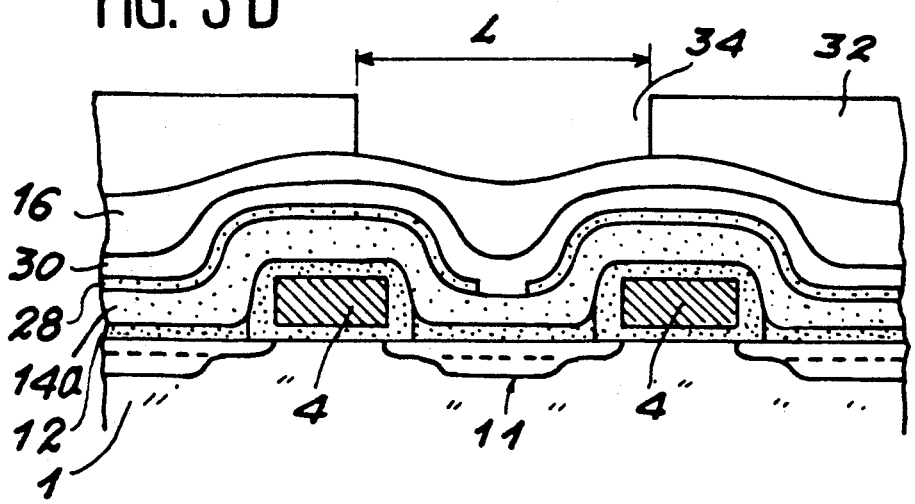

Then, as shown on FIG. 3D, a nonconducting film 30 of a non-doped oxide and in particular an intrinsic silicon oxide is deposited. This film 20 may have a thickness of 100nm and is deposited by APCVD or LPCVD by TEOS pyrolysis at 800° C.

Then the nonconducting film 16 is deposited, this film being constituted by silicated glass doped with boron and phosphorus (BPSG) by APCVD at 430° C. This film 16 may have a thickness of 500nm.

The non-doped nonconductive film 30 makes it possible to avoid diffusion of the boron or phosphorus of the glass BPSG constituting the film 16 in the polycrystalline silicon of the film 28, the latter needing to remain electrically highly resistive.

This is followed by a thermic annealing of the film 16 so as to embody a creep or flow of the latter. This annealing may be carried out in an oven at 900° C. or with the aid of lamps at 1050° C. The lamp annealing is a fast annealing generally known as RTP.

Then, a second resin mask 32 is embodied by photolithography on the film 16 comprising an opening 34 situated opposite the active zone 11 on which the electric contact is to be embodied. The diameter or width L of the opening 34 is wider than the opening 20a of the first mask 18a. This opening 34 may project onto the grids of the MOS transistors.

The width L or diameter of the opening 34 may be larger than or equal to 1.8vm instead of 0.8μm for the opening 20a. In fact, the minimum distance 1.8 μm corresponds to the distance separating the two grids 4 if the distance of the grid edge at the opening 20a is reduced to 0.5 μm.

The nonconducting film 14a thus makes it possible to have the opening 34 of the mask 32 project onto the grids 4 of the transistors whilst retaining a constant nonconducting thickness completely around these grids, this not being possible in the absence of this film 14a. In addition, this film 14a makes it possible to guarantee an adequate nonconducting thickness between the corner of the grids and the corner of the first electric contact if the latter is misaligned with respect to the grid; this thus makes it possible to also reduce the grid/contact distance (1) fixed by the mask 18a.

Figure 3E:
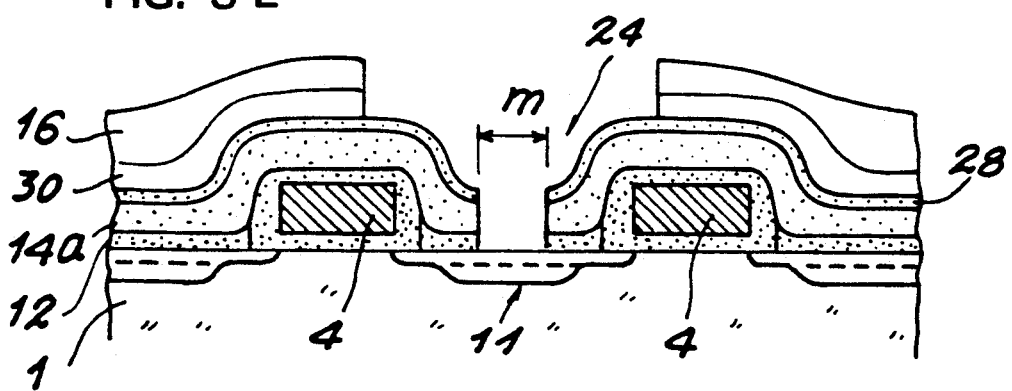
Figure 3F:
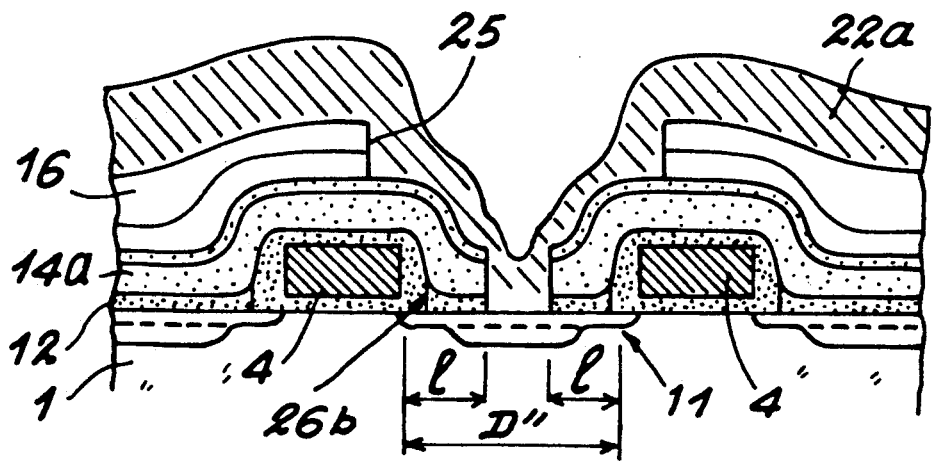

Then the films 16, 30, 14a and 12 are etched as far as the substrate 1 so as to expose the active zone 11 on which the electric contact is to be formed. The structure obtained is the one shown on FIG. 3E. The contact hole obtained bears the reference 24b.

The etching of this stack of oxide films needs to be embodied selectively with respect to the silicon 1 (selectivity exceeding 10). This etching may be a reactive ionic etching by using a CHF3-C2F6 gas mixture when all the nonconducting films are silicon oxides.

Then, the mask 32 is eliminated by oxygen plasma.

In accordance with the invention, the dimensions of the contact hole 24b formed on the active zone 11 are fixed by those of the opening 20a of the mask 18a. with the respective thicknesses of the films 12 and 14a, a contact hole is obtained with a width m identical to that of the opening 20a and equal to 0.8 μm. The dimensions and in particular the width of the contact hole 24b are thus fully controlled.

The electric contact may then be embodied by the depositing of an aluminum-based film 22a and, for example, a copper and aluminum alloy by cathodic evaporation. This film 22a has a thickness of about 800nm.

By virtue of the enlargement 25 of the upper portion of the contact hole 24b, the aluminum-based film 22a clearly fills the contact hole.

The film 22a may then be etched so as to embody the conductive line intended for connection of the active zone 11 with other active zones.

The method of the invention also makes it possible to reduce the clearances 26b to a width of 0.5 μm. Thus, the distance D" separating the two grids 4 is brought down to 1.8 μm, which makes it possible to increase the integration density of the circuits with respect to the prior art.

What is claimed is:

1. A method of providing an electric contact on an active source or drain zone of a MIS integrated circuit comprising at least two MIS transistors having gates, said method including the following steps:
   forming said active zone in a semiconductor substrate of silicon and between the gates of said at least two MIS transistors of said integrated circuit;
   oxidizing said substrate to form a silicon oxide layer;
   depositing a layer of a first electric nonconductor on the integrated circuit provided with said active zone and gates and said silicon oxide layer;
   depositing on the layer of first nonconductor an etch stop film made of a highly resistive or nonconductive material able to be etched selectively with respect to the first nonconductor and to a second electric nonconductor;
   forming a first opening opposite the active zone in the etch stop film, thus fixing the dimensions at the level of the active zone of the electric contact to be provided;
   depositing at least one layer of said second electric nonconductor on the structure obtained from the previous step;
   forming a second opening opposite the first opening in the layer of the second nonconductor, the second opening being larger than the first opening;
   etching the first nonconductor exposed during the previous step and then the silicon oxide layer by using the etch stop film as a mask, thus forming an electric contact hole on the active zone, and metallizing said contact hole.

2. The method according to claim 1, wherein the metallizing is performed with an aluminum or aluminum alloy.

3. The method according to claim 1, including the step of depositing the layer of the first electric nonconductor to a thickness of between 200 and 600 nm.

4. The method according to claim 1, including the steps of making the first and second nonconductors of silicon oxide and the etch stop film of silicon nitride or unintentionally doped polycrystalline silicon.

5. The method according to claim 4, including the step of making the second nonconductor as a double layer material with a lower film of non-doped silicon oxide and an upper film of silicon oxide doped with phosphorus and/or boron.

6. The method according to claim 1, including the following steps:
   forming said active zone;
   oxidizing said substrate;
   depositing said layer of the first electric nonconductor;
   depositing said etch stop film on said layer of the first nonconductor;
   forming a first etching mask on the etch stop film and comprising an opening opposite the active zone and fixing the dimensions of the contact at the level of said zone, and then
   etching the etch stop film;
   eliminating the first etching mask;
   depositing on the structure obtained from the previous step the layer of the second nonconductor;
   forming a second etching mask on the second nonconductor and comprising an opening opposite the active zone which is larger than the opening in the first mask;

etching the second nonconductor and then the first nonconductor and then, said silicon oxide layer, thus forming the contact hole, and metallizing the contact hole.

7. A method of providing an electric contact on an active source or drain zone of a MIS integrated circuit comprising at least two MIS transistors having gates, said method including the following steps:

forming said active zone in a semiconductor substrate of silicon and between the gates of said at least two MIS transistors of said integrated circuit;

oxidizing said substrate to form a silicon oxide layer;

depositing a layer of a first electric nonconductor having a thickness from 200 to 600 nm on the integrated circuit provided with said active zone and gates and said silicon oxide layer;

depositing on the layer of first nonconductor an etch stop film made of a highly resistive or nonconductive material able to be etched selectively with respect to the first nonconductor and to a second electric nonconductor;

forming a first opening opposite the active zone in the etch stop film, thus fixing the dimensions at the level of the active zone of the electric contact to be provided;

depositing at least one layer of said second electric nonconductor on the structure obtained from the previous step;

forming a second opening opposite the first opening in the layer of the second nonconductor, the second opening being larger than the first opening;

etching the first nonconductor exposed during the previous step and then the silicon oxide layer by using the etch stop film as a mask, thus forming an electric contact hole on the active zone, and metallizing said contact hole.

* * * * *